(12) United States Patent
Alessandro et al.

(10) Patent No.: US 10,715,143 B1
(45) Date of Patent: Jul. 14, 2020

(54) RADIATION EVENT PROTECTION CIRCUIT WITH DOUBLE REDUNDANCY AND LATCH

(71) Applicant: STMicroelectronics S.r.l., Agrate Brianza (MB) (IT)

(72) Inventors: Agatino Antonino Alessandro, Riposto (IT); Carmelo Ardizzone, Giarre (IT)

(73) Assignee: STMicroelectronics S.r.l., Agrate Brianza (MB) (IT)

(*) Notice: Subject to any disclaimer, the term of this patent is extended or adjusted under 35 U.S.C. 154(b) by 0 days.

(21) Appl. No.: 16/271,474

(22) Filed: Feb. 8, 2019

(51) Int. Cl.
*H03K 19/003* (2006.01)
*H03K 19/007* (2006.01)

(52) U.S. Cl.
CPC ... *H03K 19/00338* (2013.01); *H03K 19/0075* (2013.01)

(58) Field of Classification Search
CPC .......... H03K 19/003; H03K 19/00315; H03K 19/0033; H03K 19/00338; H03K 19/007; H03K 19/0075
See application file for complete search history.

(56) References Cited

U.S. PATENT DOCUMENTS

| 7,036,059 | B1 | 4/2006 | Carmichael et al. |
| 7,679,403 | B2 | 3/2010 | Erstad |
| 7,852,107 | B1 | 12/2010 | Sundararajan |
| 8,099,625 | B1 | 1/2012 | Tseng et al. |
| 8,489,919 | B2 | 7/2013 | Clark et al. |
| 9,378,098 | B2 | 6/2016 | Tian et al. |
| 10,013,296 | B2 | 7/2018 | El-Maleh et al. |
| 2004/0257108 | A1* | 12/2004 | Carlson ............ H03K 19/00338 326/14 |
| 2007/0103185 | A1 | 5/2007 | Friedman |
| 2012/0182048 | A1* | 7/2012 | Eaton ............... H03K 19/00338 326/122 |

OTHER PUBLICATIONS

Jan M. Rabaey, et. al, "Digital Integrated Circuits, A Design Perspective", 2nd Edition, Prentice Hall, 2003 (Year: 2003).*

* cited by examiner

*Primary Examiner* — Seokjin Kim
(74) *Attorney, Agent, or Firm* — Crowe & Dunlevy

(57) ABSTRACT

Disclosed herein is a circuit including first and second input circuits. The first input circuit is configured to receive first and second logic signals and to source current to first and second control nodes if at least one of the first and second logic signals is at a logic low. The second input circuit is configured to receive the first and second logic signals and to sink current from the first and second control nodes if at least one of the first and second logic signals is at a logic high. A first output circuit is configured to source current to an output node when current is sunk from the first control node. A second output circuit is configured to sink current from the output node when current is sourced to the second control node. A latch is coupled to the output node.

23 Claims, 7 Drawing Sheets

RADIATION EVENT PROTECTION CIRCUIT WITH DOUBLE REDUNDANCY AND LATCH

TECHNICAL FIELD

This disclosure is related to the field of voting circuits for protection against radiation events such as single event transients, and in particular, to a radiation protection circuit including a voting circuit with double redundancy and a latch.

BACKGROUND

In digital circuits and systems, a collection of logic gates that performs Boolean or logic functions on input signals to create output signals is commonly referred to as a combinational logic circuit. The basic building blocks of a combinational logic circuit are NOT, NOR, and NAND logic gates. Additionally logic gates such as OR, AND, and XOR logic gates may be constructed using these basic building blocks.

At a physical level these logic gates are formed from transistors. In particular, complementary paired transistors are configured in multiple types of configurations in order to create specific logic gates. Because transistors are made of semiconductor materials that do not withstand ions transitioning through them without a change in operating state, radiation events (e.g., particle strikes) may cause one or more transistors within a logic gate to become conductive and change their output states. A radiation event, also referred to as a glitch, may initiate logical switching in a logic circuit which may result in two basic effects: a Single Event Transient (SET) or a Single Event Upset (SEU). Typically, within the duration of a glitch, a disturbed transistor will recover back to its previous operating state unless its control voltage level has been affected by the glitch.

The first effect, a SET, is a glitch logically propagated from an affected node to a logic circuit output. If such a glitch causes a change in state of a memory circuit then this effect becomes the second type of effect: an SEU or soft error. SEU events may be detrimental to a memory circuit and circuits relying on the memory circuit. In addition, the wrong output signal at the data output of a combinatorial logic circuit could cause circuits relying on the combinatorial logic circuit to malfunction or be delayed.

One method of reducing radiation effects on a logic circuit is used to implement a majority voting scheme. A sample majority voting scheme 20 is shown in FIG. 1A, which includes three redundant logic circuits 22, 24, and 26 each receiving a same logic input 21. A respective output 23, 25, and 27 from each redundant logic circuit 22, 24, and 26 is then fed to a voting circuit 28. If a radiation event occurs, such as an SET, combinatorial logic within the voting circuit 28 is used to determine a correct output based on the "majority" of signal levels it receives. For example, if a radiation event occurs on one of the redundant logic circuits 22, 24, and 26, one of the outputs 23, 25, and 27 of one of the redundant logic circuits 22, 24, and 26 will be invalid. Because the other outputs of the redundant logic circuits 22, 24, and 26 should have a correct output, however, voting circuit 28 will provide a correct output 29 having a logic level matching that of the majority of the outputs 23, 25, and 27 of the redundant logic circuits 22, 24, and 26.

While this does provide efficient protection against radiation events, it consumes an undesirable amount of space, and may consume an undesirable amount of power.

Another option for protection against radiation events is shown in FIG. 1B. Here, rather than use redundant logic circuits and a voting circuit, filtering is used. In particular, the radiation protection circuit 30 includes a logic circuit 32 receiving an input and producing a logic output 33. An RC filter 34 receives the logic output 33 from the logic circuit 32 and has a time constant sufficient such that brief transients (a logic level different than that intended) in the logic output 33 are filtered out. The filtered output 35 provided by the RC filter 34 is therefore accurate. However, due to the time constant (which is relatively large), significant propagation delay is introduced from the logic output 33 to the output 35, limiting the potential operating frequency. Therefore, this radiation hardening circuit 30 is unsuitable for certain operations, such as generating pulse width modulation control signals.

As a consequence, further development is required.

SUMMARY

Disclosed herein is a device including a first input circuit configured to receive first and second logic signals and to source current to first and second control nodes if at least one of the first and second logic signals is at a logic low, and a second input circuit configured to receive the first and second logic signals and to sink current from the first and second control nodes if at least one of the first and second logic signals is at a logic high. A first output circuit is configured to source current to an output node when current is sunk from the first control node, and a second output circuit is configured to sink current from the output node when current is sourced to the second control node. A latch is coupled to the output node.

The first input circuit may include a first p-channel transistor having a source coupled to a supply node, a drain coupled to the first control node, and a gate biased by the first logic signal. The first input circuit may also include a second p-channel transistor having a source coupled to the supply node, a drain coupled to the first control node, and a gate biased by the second logic signal.

The second input circuit may include a first n-channel transistor having a drain coupled to the second control node, a source coupled to a reference voltage, and a gate biased by the first logic signal. The second input circuit may also include a second n-channel transistor having a drain coupled to the second control node, a source coupled to the reference voltage, and a gate biased by the second logic signal.

The first output circuit may include a third p-channel transistor having a drain coupled to the output node and a gate coupled to the first control node. The first output circuit may also include a fourth p-channel transistor having a source coupled to a supply node, a drain coupled to a source of the third p-channel transistor, and a gate coupled to the first control node.

The second output circuit may include a third n-channel transistor having a drain coupled to the output node and a gate coupled to the second control node. The second output circuit may also include a fourth n-cannel transistor having a source coupled to a reference voltage, a drain coupled to a source of the third n-channel transistor, and a gate coupled to the second control node.

A resistor may be coupled in series between the first control node and the second control node.

The first output circuit may be configured to turn off when current is sourced to the first control node. The second output circuit may also be configured to turn off when current is sunk from the second control node.

Also disclosed herein is a method aspect. This method includes receiving first and second logic signals. If the first and second logic signals both are a same logic value, the method proceeds with outputting the logic value of the first and second logic signals at an output, and if the first and second logic signals are not both a same logic value, the method proceeds with continuing to output a prior output and not outputting the logic value of the first and second logic signals at the output.

Outputting the logic value of the first and second logic signals may include latching the logic value of the first and second logic signals to the output.

Continuing to output the prior output may include maintaining a latched state of the prior output and not changing that latched state.

Additionally disclosed herein is a circuit including a first output circuit configured to source current to an output node if first and second logic signals are at a logic high, and to otherwise turn off. The circuit also includes a second output circuit configured to sink current from the output node if the first and second logic signals are at a logic low, and to otherwise turn off. A latch is coupled to the output node.

A first input circuit may be configured to turn the second output circuit on if the first and second logic signals are at a logic low, and to otherwise turn the second output circuit off. A second input circuit may be configured to turn the first output circuit on if the first and second logic signals are at a logic high, and to otherwise turn the first output circuit off.

Also disclosed herein is a circuit that includes a voting circuit configured to receive first and second logic signals, and to output a logic value of the first and second logic signals at an output node if the first and second logic signals both represent a same logic value but to otherwise turn off. A latch coupled to the output node.

The latch may include a first inverter receiving input from the output node, and a second inverter receiving input from the output node and providing output to a resistor, with the resistor coupling the output of the second inverter to the output node.

DETAILED DESCRIPTION

The following disclosure enables a person skilled in the art to make and use the subject matter disclosed herein. The general principles described herein may be applied to embodiments and applications other than those detailed above without departing from the spirit and scope of this disclosure. This disclosure is not intended to be limited to the embodiments shown, but is to be accorded the widest scope consistent with the principles and features disclosed or suggested herein.

Figure 1A:
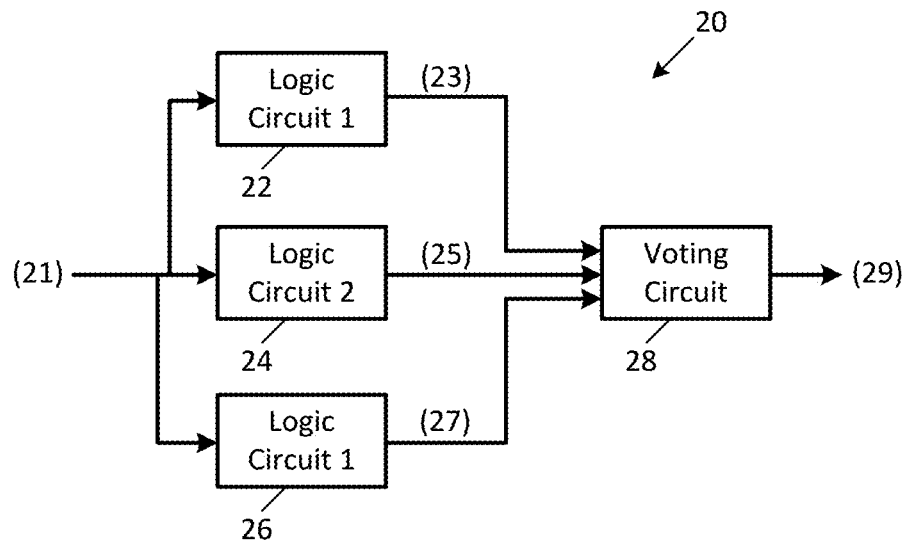
FIG. 1A is a block diagram of a prior art voting circuit with triple redundancy to protect against radiation events.
Figure 1B:
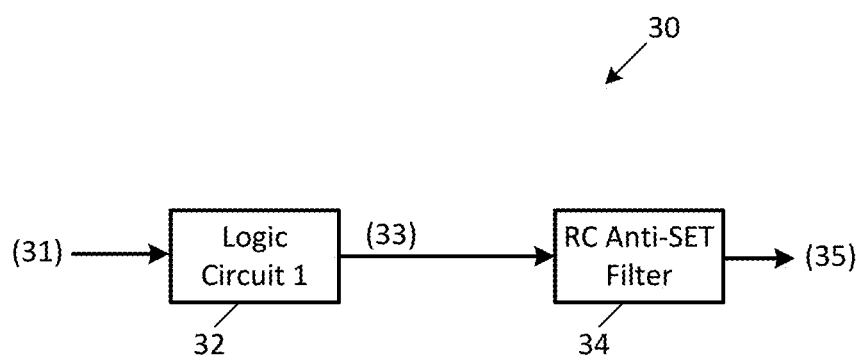
FIG. 1B is a block diagram of a prior art circuit with a filter to protect against radiation events.
Figure 2:
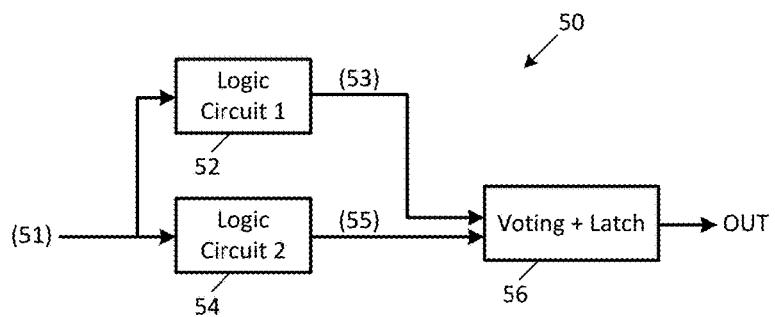
FIG. 2 is a block diagram of a voting circuit with double redundancy and a latch to protect against radiation events.

Now described with reference to FIG. 2 is a radiation protection circuit 50. The radiation protection circuit 50 includes a first logic circuit 52 and a second logic circuit 54. The first logic circuit 52 and second logic circuit 54 are identical to one another. The first and second logic circuits 52 and 54 receive a same logic input signal 51 and produce respective logic output signals 53 and 55 that will be the same in the absence of a radiation event. A voting and latch circuit 56 receives the logic output signals 53 and 55, and produces an output signal OUT based upon the logic output signals 53 and 55.

In operation, if the logic output signals 53 and 55 are at a same logic level, the voting and latch circuit 56 latches that logic level to its output as the output signal OUT. If the logic output signals 53 and 55 have different logic levels (which would indicate a radiation event), then the voting and latch circuit 56 continues to output the existing and previously latched output as the output signal OUT. This way, once the radiation event passes, the output signal OUT will transition to the logic level of the logic output signals 53 and 55. As a consequence, the radiation protection circuit 50 provides hardening or protection against radiation events, while avoiding the area consumed by triple redundancy, and while also avoiding the operating frequency limitations imposed by RC filtering.

Figure 3:
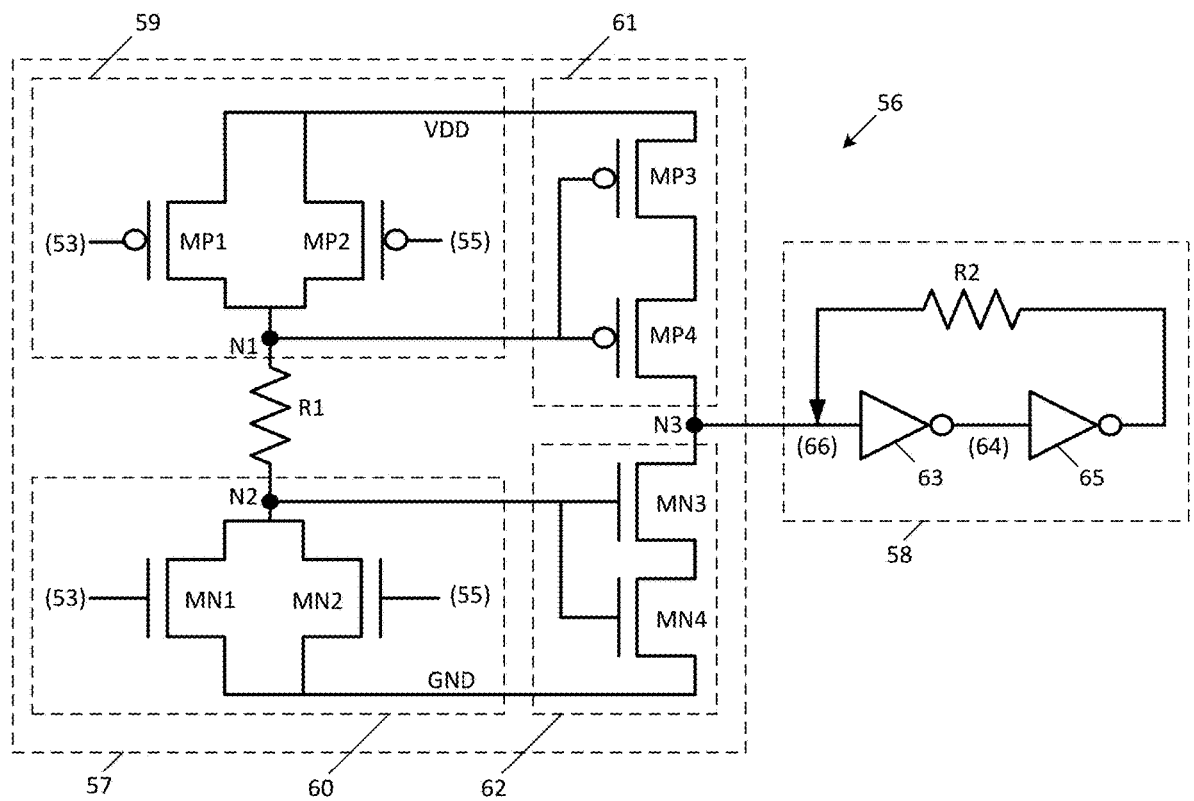
FIG. 3 is a schematic diagram of the voting circuit and latch of FIG. 2.

Implementation details of the voting and latch circuit 56 will now be described with additional reference to FIG. 3. The voting and latch circuit 56 is comprised of a voting circuit 57 and a latch circuit 58.

The latch circuit 58 is comprised of two series coupled inverters 63 and 65. The input of inverter 63 is coupled to node N3, and provides its output signal 64 to the input of inverter 65. The inverter 65 provides its output signal 66 across the resistor R2 to node N3.

The voting circuit 57 includes a first input circuit 59 and a second input circuit 60. The first input circuit 59 is comprised of parallel coupled PMOS transistors MP1 and MP2. PMOS transistor MP1 has its source coupled to a supply voltage VDD, its drain coupled to node N1, and its gate biased by the logic output signal 53. PMOS transistor MP2 has its source coupled to the supply voltage VDD, its drain coupled to node N1, and its gate biased by the logic output signal 55. The second input circuit 60 is comprised of NMOS transistors MN1 and MN2. NMOS transistor MN1 has its source coupled to a reference voltage GND (ground), its drain coupled to node N2, and its gate biased by the logic output signal 53. NMOS transistor MN2 has its source coupled to the reference voltage GND, its drain coupled to node N2, and its gate biased by the logic output signal 55. Note that nodes N1 and N2 are coupled in series by a resistor R1.

The voting circuit 57 also includes a first output circuit 61 and a second output circuit 62. The first output circuit 61 includes series coupled PMOS transistors MP3 and MP4. PMOS transistor MP3 has its source coupled to the supply voltage VDD, its drain coupled to a source of PMOS transistor MP4, and its gate coupled to node N1. PMOS transistor MP4 has its source coupled to the drain of PMOS transistor MP3, its drain coupled to node N3, and its gate also coupled to node N1. The second output circuit 62 includes series coupled NMOS transistors MN3 and MN4. NMOS transistor MN3 has its drain coupled to node N3, its source coupled to the drain of NMOS transistor MN4, and its gate coupled to node N2. NMOS transistor MN4 has its drain coupled to the source of NMOS transistor MN3, its source coupled to the reference voltage GND, and its gate coupled to node N2.

In operation, the first input circuit 59 will source current to nodes N1 and N2 if at least one of the logic output signals 53 and 55 is at a logic low level, and the second input circuit 60 will sink current from nodes N1 and N2 if at least one of the logic output signals 53 and 55 is at a logic high level. If current is sourced to node N1 yet is not sunk from node N2, the first output circuit 61 will turn off and the second output circuit 62 will turn on, and the latch circuit 58 will latch a logic low as the output signal 66. If current is sunk from node N2 yet is not sourced to node N1, the first output circuit 61 will turn on and the second output circuit 62 will turn off, and the latch circuit 58 will latch a logic high at as an output signal 66. Due to the separation (voltage drop) provided by the resistor R1, if current is both sourced to node N1 and sunk from node N2 (which will occur where the logic output signals 53 and 55 are unequal due to a radiation event), both the first and second output circuits 61 and 62 will turn off, the node N3 will be in a tristate condition and the latch circuit 58 will continue to output the previously latched output signal 66.

In greater detail, each of the PMOS transistors MP1 and MP2 will turn on if their respective logic output signals 53 and 55 are low, resulting in sourcing of current to node N1, through resistor R1, and to node N2. Likewise, each of the NMOS transistors MN1 and MN2 will turn on if their respective logic output signals 53 and 55 are high, resulting in sinking of current from node N2, and thus from node N1 through resistor R1.

Therefore, it is to be appreciated that in the case where the logic output signals 53 and 55 are both at a logic high, PMOS transistors MP1 and MP2 are switched off, while NMOS transistors MN1 and MN2 are switched on. As a result, node N1, which acts as a control node for the PMOS transistors MP3 and MP4, is low, and the PMOS transistors MP3 and MP4 will turn on. As another result, node N2, which acts as a control node for the NMOS transistors MN3 and MN4, is also low, and the NMOS transistors MN3 and MN4 will turn off. The effect of this is current being sourced to node N3 by PMOS transistors MP3 and MP4 to cause a logic high to be latched as the output signal 66 by the latch circuit 58.

Figure 4A:
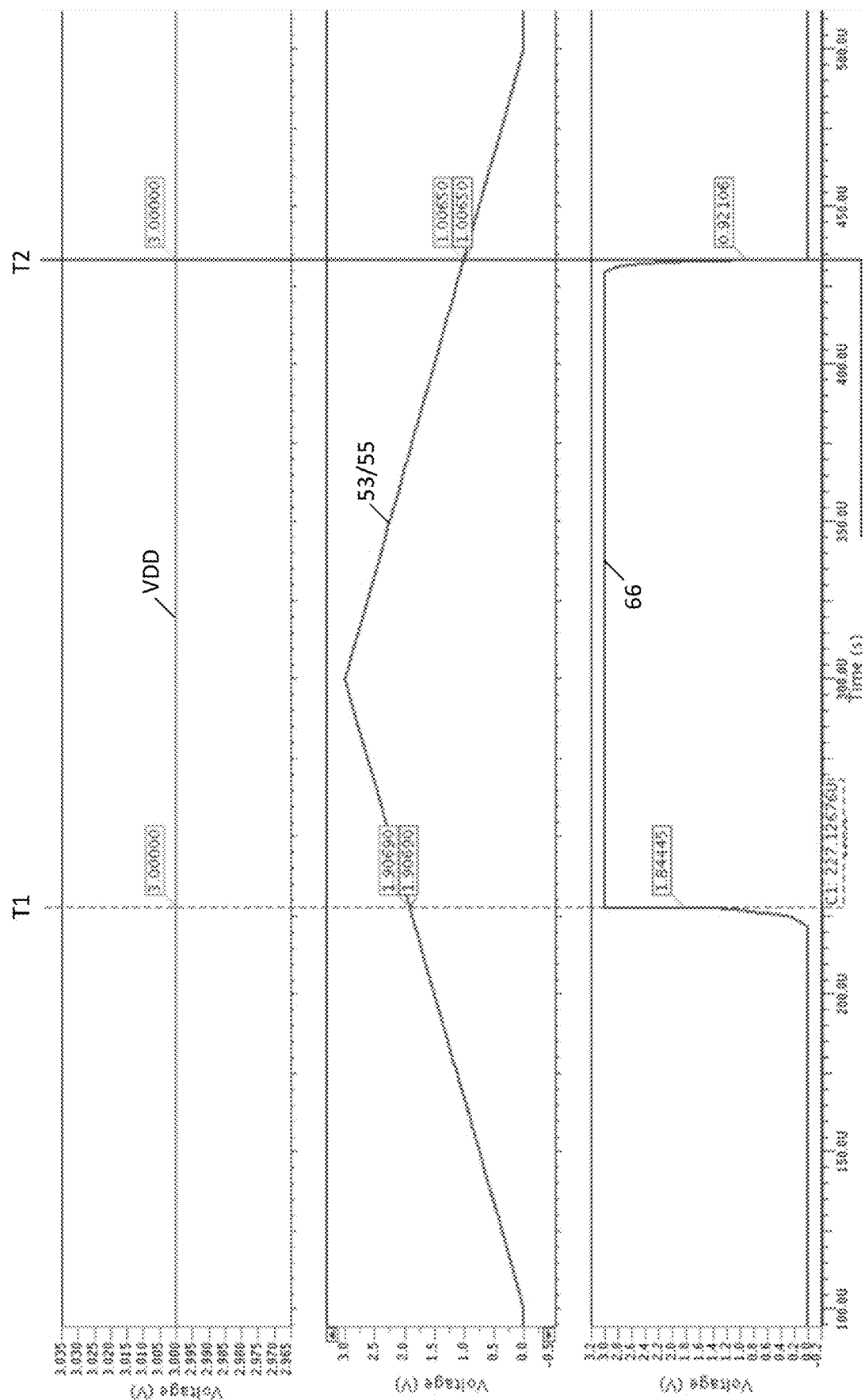
FIG. 4A is a graph of FIG. 3 in operation showing inputs to the voting circuit and the latch output, to illustrate passing of a logic high logic signal from input to output in the absence of a radiation event.

A sample operation showing this operating condition is contained in FIG. 4A. Here, it can be seen that the logic output signals 53 and 55 are generally equal in voltage and therefore equal in logic level. At time T1, the logic output signals 53 and 55 both rise sufficiently in voltage to transition to a logic high state, and do not drop sufficiently in voltage to transition from the logic high state to a logic low state until time T2. Therefore, between times T1 and T2, the output signal 66 is latched at a logic high, because at these times the first input circuit 59 is turned off (due to the PMOS transistors MP1, MP2 being switched off by the logic output signals 53, 55) while the second input circuit 60 is turned on (due to the NMOS transistors MN1, MN2 being turned on by the logic output signals 53, 55), resulting in the first output circuit 61 being turned on (due to NMOS transistors MN1, MN2 sinking current from node N1 to turn on PMOS transistors MP3, MP4) while the second output circuit 62 is turned off (due to the NMOS transistors MN1, MN2 sinking current from node N2 to turn off NMOS transistors MN3, MN4).

It is likewise to be appreciated that in the case where the logic output signals 53 and 55 are both at a logic low, PMOS transistors MP1 and MP2 are turned on, while NMOS transistors MN1 and MN2 are switched off. As a result, node N1 is high, and the PMOS transistors MP3 and MP4 will turn off. As another result, node N2 is also high, and the NMOS transistors MN3 and MN4 will turn on. The effect of this is current being sunk from node N3 by NMOS transistors MN3 and MN4 to cause a logic low to be latched as the output signal 66 by the latch circuit 58.

Figure 4B:
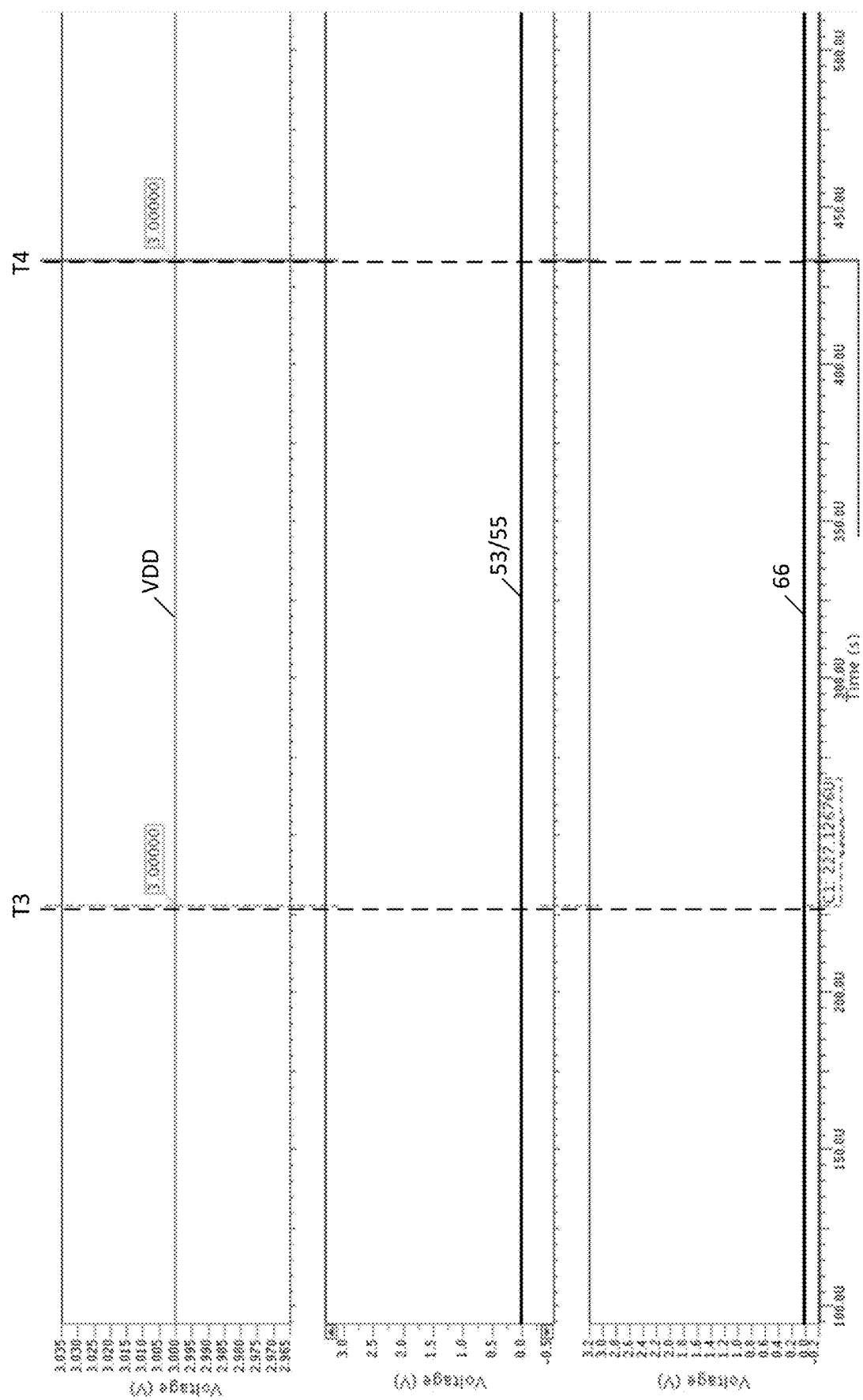
FIG. 4B is a graph of FIG. 3 in operation showing inputs to the voting circuit and the latch output, to illustrate passing of a logic low logic signal from input to output in the absence of a radiation event.

A sample operation showing this operating condition is contained in FIG. 4B. Here, it can be seen that the logic output signals 53 and 55 are generally equal in voltage and therefore equal in logic level. Between times T3 and T4, the logic output signals 53 and 55 remain at a logic low state. Therefore, between times T3 and T4, the output signal 66 is latched at a logic low, because at these times the first input circuit 59 is turned on (due to the PMOS transistors MP1, MP2 being switched on by the logic output signals 53, 55) while the second input circuit 60 is turned off (due to the NMOS transistors MN1, MN2 being turned off by the logic output signals 53, 55), resulting in the first output circuit 61 being turned off (due to PMOS transistors MP1, MP2 sourcing current to node N1 to turn off PMOS transistors MP3, MP4) while the second output circuit 62 is turned on (due to the PMOS transistors MP1, MP2 sourcing current to node N2 to turn on NMOS transistors MN3, MN4).

Now consider the case where due to a radiation event, the logic output signals 53 and 55 will be at different logic levels. The result is that one of the PMOS transistors MP1 and MP2 will turn on, and also that one of the NMOS transistors MN1 and MN2 will turn on. Due to the separation (voltage drop) provided by resistor R1, this will result in node N1 being high while node N2 is low. The effect of this is that current is neither sourced nor sunk to node N3, but this node N3 does not float due to the action of the latch circuit 58.

Figure 5:
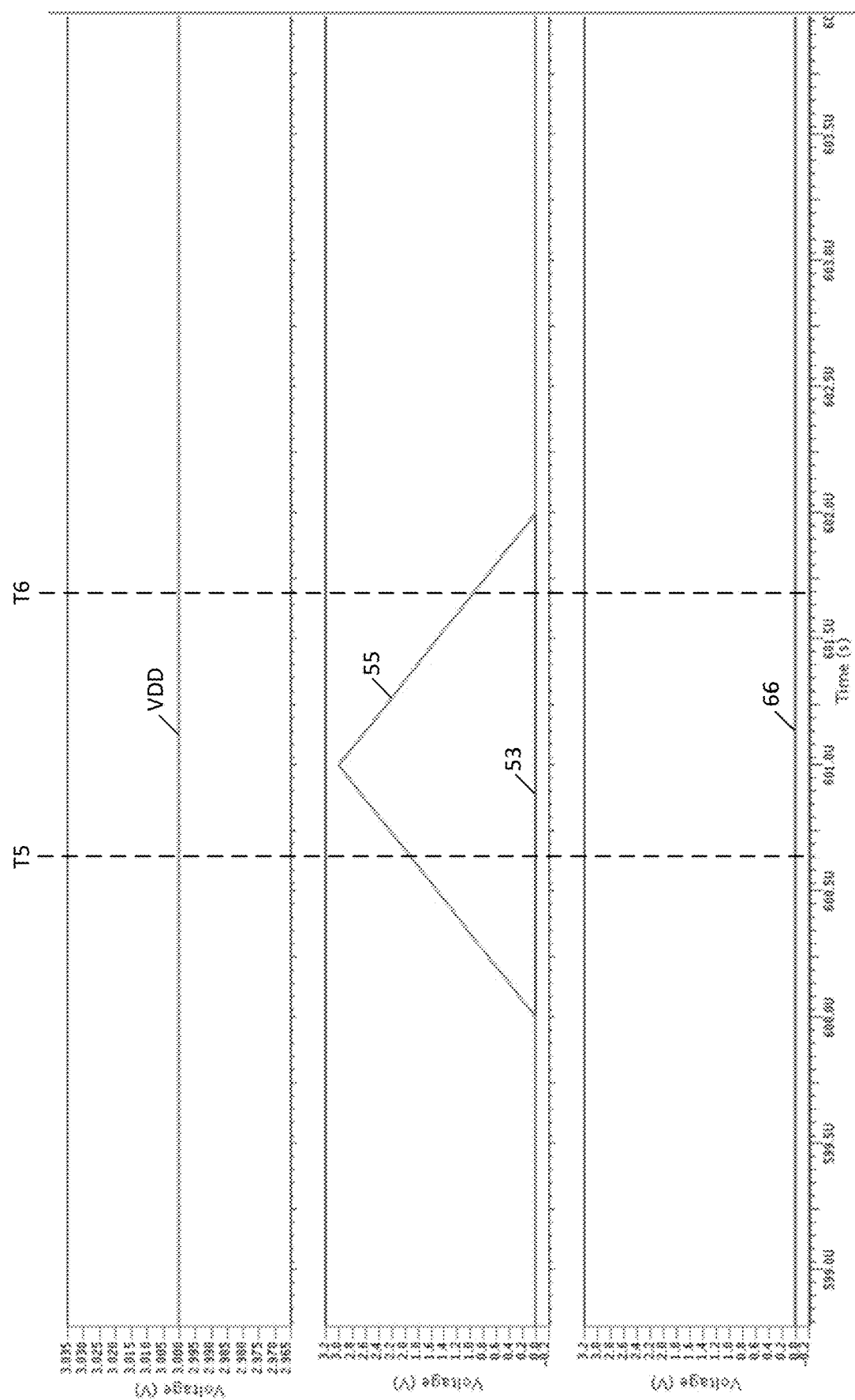
FIG. 5 is a graph of FIG. 3 in operation showing inputs to the voting circuit and the latch output, to illustrate protection against a positive spike radiation event.

A sample operation is shown in FIG. 5 where a transient radiation event causes the logic output signal 55 to spike to a logic high by time T5 and remain high until time T6, while the logic output signal 53 remains (correctly) at a logic low. Note that the output signal 66 remains low between times T5 and T6. Therefore, between times T5 and T6, both the first input circuit 59 and second input circuit 60 are on (due to logic output signal 53 turning on PMOS transistor MP1 and logic output signal 55 turning on NMOS transistor MN2), meaning that both the first output circuit 61 and the second output circuit 62 are switched off (due to PMOS transistor MP1 sourcing current to node N1 to turn off PMOS transistors MP3, MP4 and due to NMOS transistor MN2 sinking current from node N2 to turn off NMOS transistors MN3, MN4), with the result being that the latch circuit 58 does not transition and the previous output signal 66 will remain latched.

Figure 6:
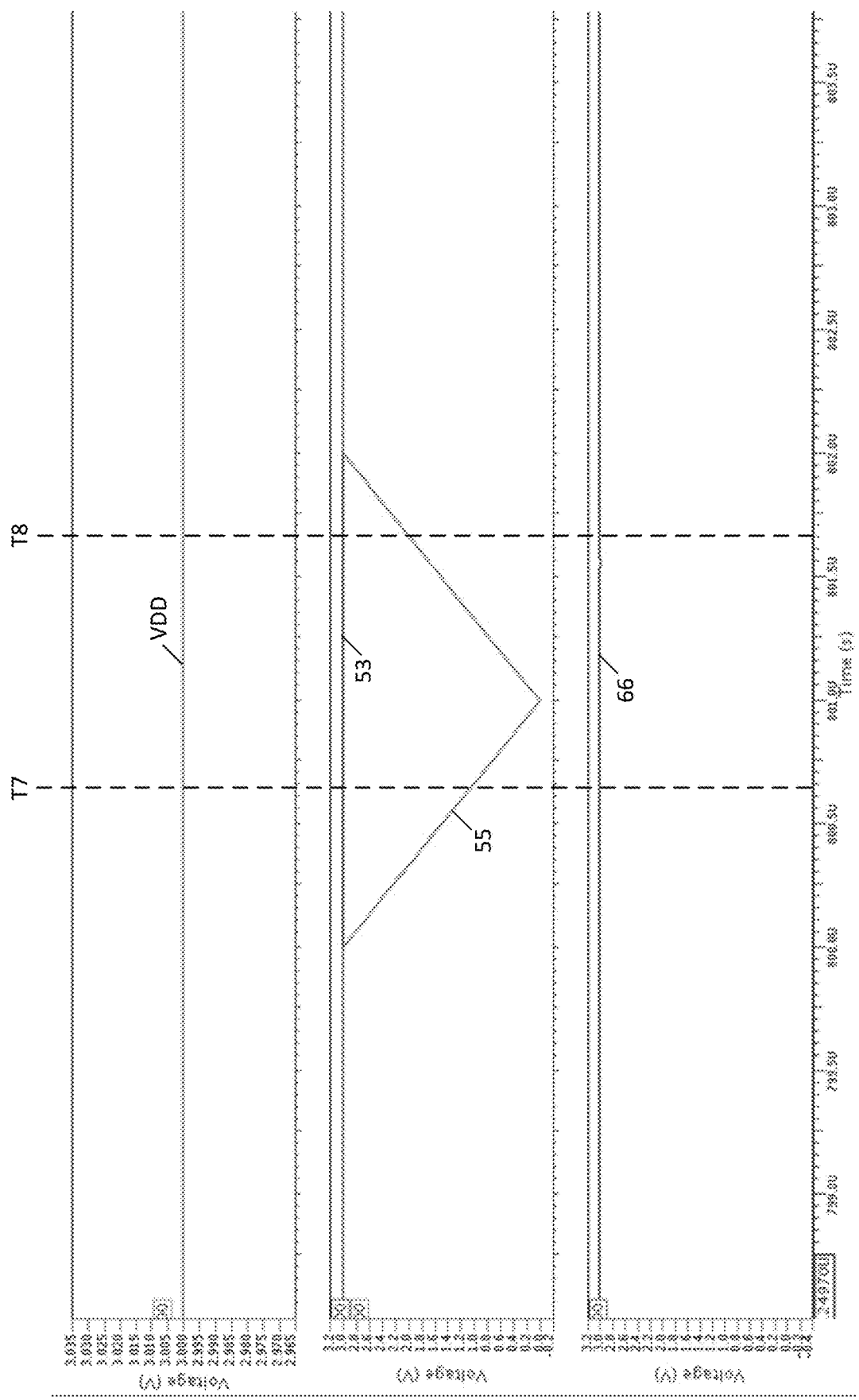
FIG. 6 is a graph of FIG. 3 in operation showing inputs to the voting circuit and the latch output, to illustrate protection against a negative spike radiation event.

Another sample operation is shown in FIG. 6 where a transient radiation event causes the logic output signal 55 to spike to a logic low by time T7 and remain low until time T8, while the logic output signal 53 remains (correctly) at a logic high. Note that the output signal 66 remains high between times T7 and T8. Therefore, between times T7 and T8, both the first input circuit 59 and second input circuit 60 are on (due to logic output signal 55 turning PMOS transistor MP2 on and due to logic output signal 55 turning NMOS transistor MN1 on), meaning that both the first output circuit 61 and the second output circuit 62 are switched off (due to PMOS transistor MP2 sourcing current to node N1 to turn off PMOS transistors MP3, MP4 and NMOS transistor MN1 sinking current from node N2 to turn off NMOS transistors MN3, MN4), with the result being that the latch circuit 58 keeps the value of the output signal 66.

Figure 7:
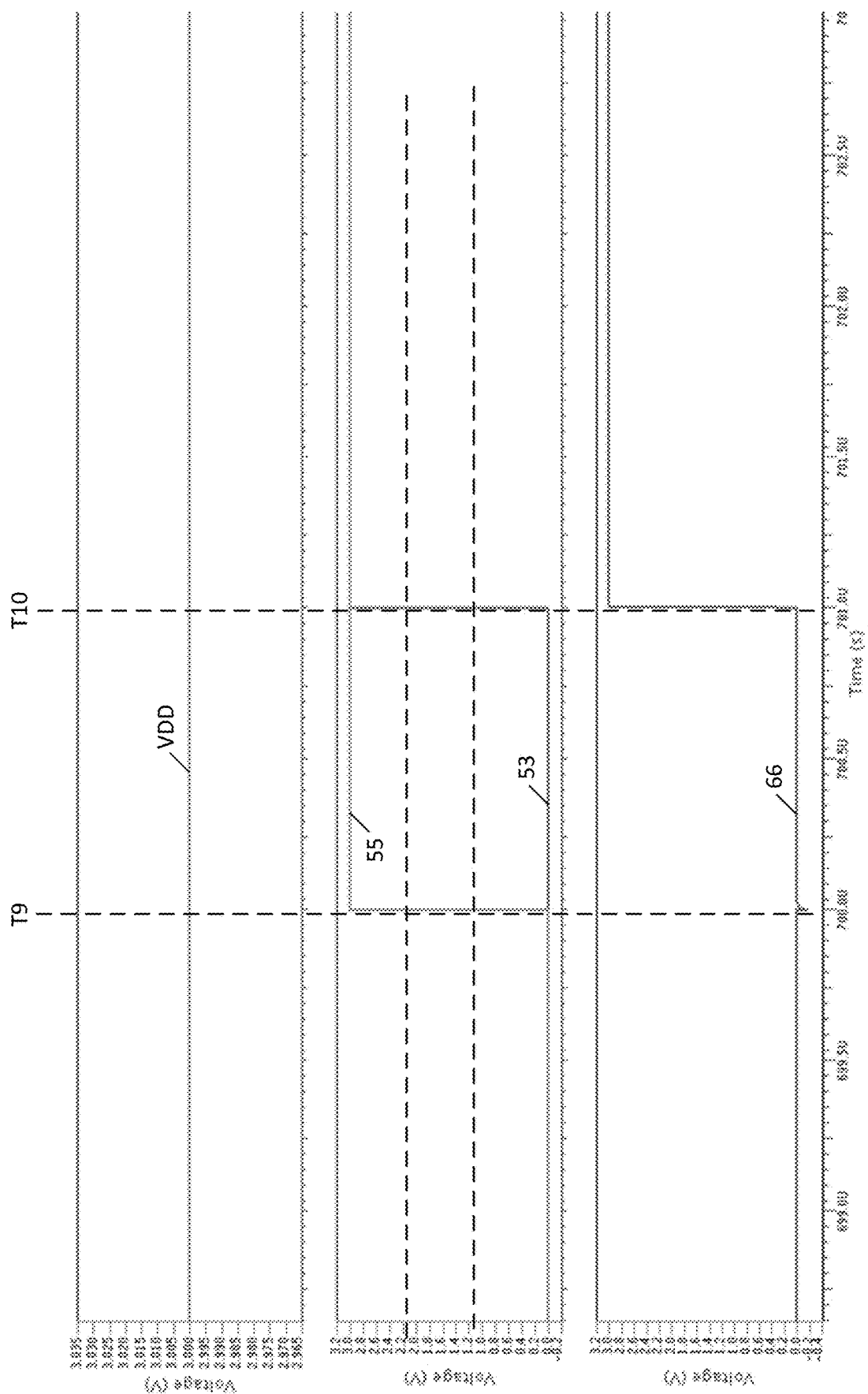
FIG. 7 is a graph of FIG. 3 in operation showing inputs to the voting circuit and the latch output, to illustrate passing of the logic signal from input to output only when the inputs of the voting circuit match.

A sample operation showing a radiation event, and then an end of the radiation event, is in FIG. 7. Here, at time T9, it is intended for both the logic output signals 53 and 55 to rise to a logic high. However, due to a radiation event, only the logic output signal 55 rises to a logic high while the logic output signal 53 remains at a logic low. Therefore, between times T9 and T10, the output signal 66 remains latched at a logic low, since that was the previous output signal 66. However, by time T10, the radiation event has ended, and the logic output signal 53 rises to a logic high. Thus, at time T10, the output signal 66 transitions to, and is latched at, a logic high. Between times T9 and T10, both the first input circuit 59 and second input circuit 60 are on (due to logic output signal 53 turning on PMOS transistor MP1 and logic output signal 55 turning on NMOS transistor MN2), meaning that both the first output circuit 61 and the second output circuit 62 are switched off (due to PMOS transistor MP1 sourcing current to node N1 to turn off PMOS transistors MP3, MP4 and NMOS transistor MN2 sinking current from node N2 to turn off NMOS transistors MN3, MN4), with the result being that the latch circuit 58 does not transition and the previous output signal 66 will remain latched. At time T10, the first input circuit 59 is switched off and the second input circuit 60 is switched on (due to logic output signals 53, 55 turning off PMOS transistors MP1, MP2 and turning on NMOS transistors MN1, MN2), therefore switching on the first output circuit 61 and switching off the second output circuit 62 (due to NMOS transistors sinking current from nodes N1, N2 to turn on PMOS transistors MP3, MP4 and turn off NMOS transistors MN3, MN4), with the result being that the latch circuit 58 transitions its output signal 66 to a logic high and latches.

Therefore, it can be seen that despite the lack of a third redundancy or an RC filter, robust protection from radiation events is obtained using the radiation protection circuit 50, as the latch circuit 58 in conjunction with double redundancy of the first and second logic circuits 52 and 54 provides for excellent resistance to radiation events, acting as a filter with a time constant that is always at the minimum level required. In addition, this radiation protection circuit 50 also provides protection and resistance to noise due to hysteresis.

From FIG. 4A, it can be seen that the output signal 66 switches with input 53, 55 hysteresis like a Schmitt trigger. Therefore, the voting and latch circuit 56 can be used in the same fashion as a Schmitt trigger. As such, the voting and latch circuit 56 is quite effective for use in radiation hardening with redundant comparators.

In addition, the voting and latch circuit 56 can be also used to help provide protection from radiation events for higher frequency signals, such as pulse width modulation control signals.

While the disclosure has been described with respect to a limited number of embodiments, those skilled in the art, having benefit of this disclosure, will appreciate that other embodiments can be envisioned that do not depart from the scope of the disclosure as disclosed herein. Accordingly, the scope of the disclosure shall be limited only by the attached claims.

The invention claimed is:

1. A circuit, comprising:
   a first input circuit configured to receive first and second logic signals and to source current to first and second control nodes when at least one of the first and second logic signals is at a logic low;
   a second input circuit configured to receive the first and second logic signals and to sink current from the first and second control nodes when at least one of the first and second logic signals is at a logic high;
   a first output circuit configured to source current to an output node when current is sunk from the first control node, wherein the first output circuit comprises:
      a third p-channel transistor having a drain coupled to the output node and a gate coupled to the first control node; and
      a fourth p-channel transistor having a source coupled to a supply node, a drain coupled to a source of the third p-channel transistor, and a gate coupled to the first control node;
   a second output circuit configured to sink current from the output node when current is sourced to the second control node; and
   a latch coupled to the output node.

2. The circuit of claim 1, wherein the first input circuit comprises:
   a first p-channel transistor having a source coupled to a supply node, a drain coupled to the first control node, and a gate biased by the first logic signal; and
   a second p-channel transistor having a source coupled to the supply node, a drain coupled to the first control node, and a gate biased by the second logic signal.

3. The circuit of claim 1, wherein the second input circuit comprises:
   a first n-channel transistor having a drain coupled to the second control node, a source coupled to a reference voltage, and a gate biased by the first logic signal; and
   a second n-channel transistor having a drain coupled to the second control node, a source coupled to the reference voltage, and a gate biased by the second logic signal.

4. A circuit, comprising:
   a first input circuit configured to receive first and second logic signals and to source current to first and second control nodes when at least one of the first and second logic signals is at a logic low;
   a second input circuit configured to receive the first and second logic signals and to sink current from the first and second control nodes when at least one of the first and second logic signals is at a logic high;
   a first output circuit configured to source current to an output node when current is sunk from the first control node;
   a second output circuit configured to sink current from the output node when current is sourced to the second control node, wherein the second output circuit comprises:
      a third n-channel transistor having a drain coupled to the output node and a gate coupled to the second control node; and a fourth n-channel transistor having a source coupled to a reference voltage, a drain coupled to a source of the third n-channel transistor, and a gate coupled to the second control node; and a latch coupled to the output node.

5. The circuit of claim 1, further comprising a resistor coupled in series between the first control node and the second control node.

6. The circuit of claim 1, wherein the first output circuit is configured to turn off when current is sourced to the first control node.

7. The circuit of claim 6, wherein the second output circuit is configured to turn off when current is sunk from the second control node.

8. A method, comprising:
receiving first and second logic signals;
when the first and second logic signals both are a same logic value, turning on two parallel connected transistors to thereby cause turning on of two series connected transistors to cause outputting of the logic value of the first and second logic signals at an output; and
when the first and second logic signals are not both a same logic value, continuing to output a prior output and not outputting the logic value of the first and second logic signals at the output.

9. The method of claim 8, wherein outputting the logic value of the first and second logic signals comprises latching the logic value of the first and second logic signals to the output.

10. The method of claim 8, wherein continuing to output the prior output comprises maintaining a latched state of the prior output and not changing that latched state.

11. A circuit, comprising:
a first output circuit configured to source current to an output node when first and second logic signals are at a logic high, and to otherwise turn off for all other logical combinations of the first and second logic signals, wherein the first output circuit comprises:
a third p-channel transistor having a drain coupled to the output node and a gate coupled to a first control node; and
a fourth p-channel transistor having a source coupled to a supply node, a drain coupled to a source of the third p-channel transistor, and a gate coupled to the first control node;
a second output circuit configured to sink current from the output node when the first and second logic signals are at a logic low, and to otherwise turn off; and
a latch coupled to the output node.

12. The circuit of claim 11, further comprising:
a first input circuit configured to turn the second output circuit on when the first and second logic signals are at a logic low, and to otherwise turn the second output circuit off; and
a second input circuit configured to turn the first output circuit on when the first and second logic signals are at a logic high, and to otherwise turn the first output circuit off.

13. A circuit, comprising:
a voting circuit configured to receive first and second logic signals, and to turn on two parallel connected transistors to thereby cause turning on of two series connected transistors to cause output of a logic value of the first and second logic signals at an output node when the first and second logic signals both represent a same logic value, but to otherwise turn off; and
a latch coupled to the output node.

14. The circuit of claim 13, wherein the latch comprises a first inverter receiving input from the output node, a second inverter receiving input from the output node and providing output to a resistor, wherein the resistor couples the output of the second inverter to the output node.

15. The circuit of claim 4, wherein the first input circuit comprises:
a first p-channel transistor having a source coupled to a supply node, a drain coupled to the first control node, and a gate biased by the first logic signal; and
a second p-channel transistor having a source coupled to the supply node, a drain coupled to the first control node, and a gate biased by the second logic signal.

16. The circuit of claim 4, wherein the second input circuit comprises:
a first n-channel transistor having a drain coupled to the second control node, a source coupled to a reference voltage, and a gate biased by the first logic signal; and
a second n-channel transistor having a drain coupled to the second control node, a source coupled to the reference voltage, and a gate biased by the second logic signal.

17. The circuit of claim 4, further comprising a resistor coupled in series between the first control node and the second control node.

18. The circuit of claim 4, wherein the first output circuit is configured to turn off when current is sourced to the first control node.

19. The circuit of claim 18, wherein the second output circuit is configured to turn off when current is sunk from the second control node.

20. A circuit, comprising:
a first output circuit configured to source current to an output node when first and second logic signals are at a logic high, and to otherwise turn off for all other logical combinations of the first and second logic signals;
a second output circuit configured to sink current from the output node when the first and second logic signals are at a logic low, and to otherwise turn off, wherein the second output circuit comprises: a third n-channel transistor having a drain coupled to the output node and a gate coupled to a second control node; and a fourth n-channel transistor having a source coupled to a reference voltage, a drain coupled to a source of the third n-channel transistor, and a gate coupled to the second control node; and
a latch coupled to the output node.

21. The circuit of claim 20, further comprising a resistor coupled in series between a first control node and the second control node.

22. The circuit of claim 20, wherein the first output circuit is configured to turn off when current is sourced to a first control node.

23. The circuit of claim 22, wherein the second output circuit is configured to turn off when current is sunk from the second control node.

* * * * *